(12) United States Patent
Seliverstov

(10) Patent No.: US 7,710,212 B2
(45) Date of Patent: May 4, 2010

(54) CRYSTAL OSCILLATOR WITH VARIABLE-GAIN AND VARIABLE-OUTPUT-IMPEDANCE INVERTER SYSTEM

(75) Inventor: Anatol Seliverstov, Framingham, MA (US)

(73) Assignee: Analog Devices, Inc., Norwood, MA (US)

( * ) Notice: Subject to any disclaimer, the term of this patent is extended or adjusted under 35 U.S.C. 154(b) by 120 days.

(21) Appl. No.: 11/880,589

(22) Filed: Jul. 23, 2007

(65) Prior Publication Data
US 2009/0027133 A1     Jan. 29, 2009

(51) Int. Cl.
*H03B 5/36*     (2006.01)
(52) U.S. Cl. .................. 331/183; 331/158; 331/186
(58) Field of Classification Search ............ 331/158, 331/183, 186
See application file for complete search history.

(56) References Cited

U.S. PATENT DOCUMENTS

| | | | |
|---|---|---|---|
| 5,117,206 A | 5/1992 | Imamura | |
| 6,590,460 B1 * | 7/2003 | Tenten et al. ............... | 331/74 |
| 7,233,772 B1 | 6/2007 | Darabi et al. | |
| 7,348,861 B1 * | 3/2008 | Wu et al. ................. | 331/158 |
| 2002/0127988 A1 | 9/2002 | Humes et al. | |
| 2003/0214330 A1 | 11/2003 | Tanigashira et al. | |
| 2006/0284687 A1 | 12/2006 | Abel | |

OTHER PUBLICATIONS

Williamson, T., *Oscillators for Microcontrollers*, Intel AP-155 Application Note, Jun. 1983 RCA/Solid State/COS/MOS Integrated Circuits Manual CMS 272, VII *Crystal Oscillators for Digital Timekeeping*, p. 57-64.
KSS Electronics, Technical handbook for Kinseki customers. *Basic Information of Crystal Units and Matching Technology for Crystal Osciallators*, 2002, 42 pages.
Philips, *Designers Guide, High Speed CMOS, Crystal Oscillators*, Jan. 1986, pp. 113-116.
Statek Corporation, Technical Note 31, *Practical Analysis of the Pierce Oscillator*, 4 pages.
Statek Corporation, Technical Note 32, *The Quartz Crystal Model and its Frequencies*, 9 pages.
Vittoz et al., *High Performance Crystal Oscillator Circuits: Theory and Application*, IEEE Journal of Solid State Circuits, vol. 23, No. 3, Jun. 1988, pp. 774, 783.
Andreas Rusznyak, Start-Up Time of CMOS Oscillators, IEEE Transactions on Circuits and Systems, vol. CAS-34, No. 3 Mar. 1987, pp. 259=268.
Meyer et al., MOS Crystal Oscillator Design, IEEE Journal of Solid State Circuits, vol. SC-15, No. 2, Apr. 1980, pp. 222-228.

* cited by examiner

*Primary Examiner*—Robert Pascal
*Assistant Examiner*—James E Goodley
(74) *Attorney, Agent, or Firm*—Goodwin Procter LLP

(57) ABSTRACT

A crystal oscillator with variable gain and variable output impedance inverter system includes an inverter, a variable impedance feedback circuit, connected between the output and input of the inverter, a crystal oscillator system, having a crystal with first and second electrodes connected across the input and output of the inverter; a serial variable impedance circuit connected between the inverter output and an electrode of the crystal and a control circuit for temporarily, during start up mode, increasing the impedance of the feedback circuit and decreasing the impedance of the serial circuit relative to the stationary mode impedances and then returning the feedback impedance to the lower impedance level and the serial circuit to the higher impedance level that promotes high frequency stability of the oscillator in the normal, stationary mode, of operation.

11 Claims, 3 Drawing Sheets

CRYSTAL OSCILLATOR WITH VARIABLE-GAIN AND VARIABLE-OUTPUT-IMPEDANCE INVERTER SYSTEM

FIELD OF THE INVENTION

This invention relates to an improved oscillator with a variable gain and variable output impedance inverter system which provides both very reliable start-up and high frequency stability during stationary operations.

BACKGROUND OF THE INVENTION

Contemporary microcontrollers and processors typically contain an inverter-amplifier that is suitable for use as a part of feedback oscillator when it is connected to an external crystal and some other components. A typical crystal oscillator system includes an inverter amplifier with two extra resistances Rf and Rs. Feedback resistance Rf is connected between the input and the output of the inverter/amplifier and provides proper DC biasing and negative feedback. Serial limiting resistance Rs is connected from the output of inverter-amplifier to one of the crystal pins and ensures proper output impedance and power for the crystal oscillator system. The other components of the crystal oscillator system are capacitors CL1 and CL2 connecting the electrodes of the crystal to ground (GND). The values of CL1 and CL2 are determined by the manufacturer's specifications according to the intended use of the crystal. There is a limited choice of component selection to provide specified crystal oscillator characteristics. It is basically limited to the choice of values of Rf and Rs. A desired characteristic of crystal oscillator systems is frequency stability in the specified range of operating voltages, temperatures and variations of parameters of crystal and inverter/amplifier. Another important characteristic of crystal oscillator systems is the ability for fast oscillation start up on power up of supply voltage. Yet another important characteristic of a crystal oscillator system is a drive level compatible with the specified power dissipation in the crystal. Usually crystal manufacturers give the operating voltage drive levels of the crystal in microwatts for specified crystal long and short term stability. Drive levels of the crystal directly effect the stability of the crystal oscillator system: frequency stable crystal oscillator system should have a drive voltage level no more than the specified drive voltage level. Unfortunately the values of Rf and Rs are very difficult to chose to satisfy all main crystal oscillator characteristics: for better frequency stability the value of Rf needs to be small and the value of Rs needs to be high; for reliable oscillation start-up the value of Rf needs to be high and the value of Rs needs to be small. That forces a compromise between the values of Rf and Rs to partly satisfy both frequency stability and reliable start-up of the crystal oscillator and results in a non-optimal operation of the crystal oscillator. The problem is exacerbated for so called "low power" crystal oscillator systems which have very small size and relatively low price compared with so called "high power" crystal oscillator systems. The majority of existing processors have been designed for "high power" crystals which make it more difficult to use them with "low power" crystals.

BRIEF SUMMARY OF THE INVENTION

It is therefore an object of this invention to provide an improved crystal oscillator which provides both very reliable start up and high frequency stability during stationary operation.

It is a further object of this invention to provide such an improved crystal oscillator with a variable gain and variable output impedance inverter.

It is a further object of this invention to provide such an improved crystal oscillator with a variable gain and variable output impedance inverter system which optimizes operation in both the start up and stationary modes.

It is a further object of this invention to provide such an improved crystal oscillator with a variable gain and variable output impedance inverter system which provides low feedback impedance and high series impedance for stationary mode operation and high feedback impedance and low series impedance, temporarily, during start up mode.

The invention results from the realization that an improved crystal oscillator which provides both very reliable start up as well as high frequency stability during stationary operation can be achieved using a control circuit to temporarily, during start up mode, increase the impedance of the feedback circuit and decrease the impedance of the serial circuit to provide fast start up, then return the feedback impedance to the lower impedance level and the serial circuit to the higher impedance level that promotes high frequency stability of the oscillator in the normal, stationary mode of operation.

The subject invention, however, in other embodiments, need not achieve all these objectives and the claims hereof should not be limited to structures or methods capable of achieving these objectives.

This invention features a crystal oscillator with a variable gain and variable output impedance inverter system. There is an inverter and variable impedance feedback circuit connected between the output and input of the inverter. The crystal oscillator system includes a crystal having first and second electrodes connected across the input and output of the inverter. A serial variable impedance circuit is connected between the inverter output and an electrode of the crystal. A control circuit temporarily, during start up mode, increases the impedance of the feedback circuit and decreases the impedance of the serial circuit relative to the stationary mode impedances.

In a preferred embodiment the impedances may be resistances. The feedback impedance circuit may include first and second resistances in series and a first switch shunting one of the resistances. The serial impedance circuit may include at least a third resistance and a second switch shunting the third resistance. There may be a fourth resistance in series with the third resistance. The first and second resistances may be equal and the third and fourth resistances may be equal. The crystal system may include a load capacitor connected from each of the crystal electrodes to ground. The control circuit may include a comparator responsive to the crystal oscillator voltage for temporarily increasing the impedance of the feedback circuit and decreasing the impedance of the serial circuit during start up mode until the crystal oscillator voltage reaches a predetermined reference level. The reference level may be approximately one half or more of the stationary mode crystal oscillator voltage. The control circuit may include a timer for temporarily increasing the impedance of the feedback circuit and decreasing the impedance of the serial circuit during start up mode for a period of approximately 500 cycles of the crystal oscillator frequency. The control circuit may include a comparator responsive to the crystal oscillator voltage for temporarily operating the switches during start up mode until the crystal oscillator voltage reaches a predetermined reference level. The control circuit may include a timer for temporarily operating the switches during start up mode for approximately 500 cycles of the crystal oscillator frequency.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
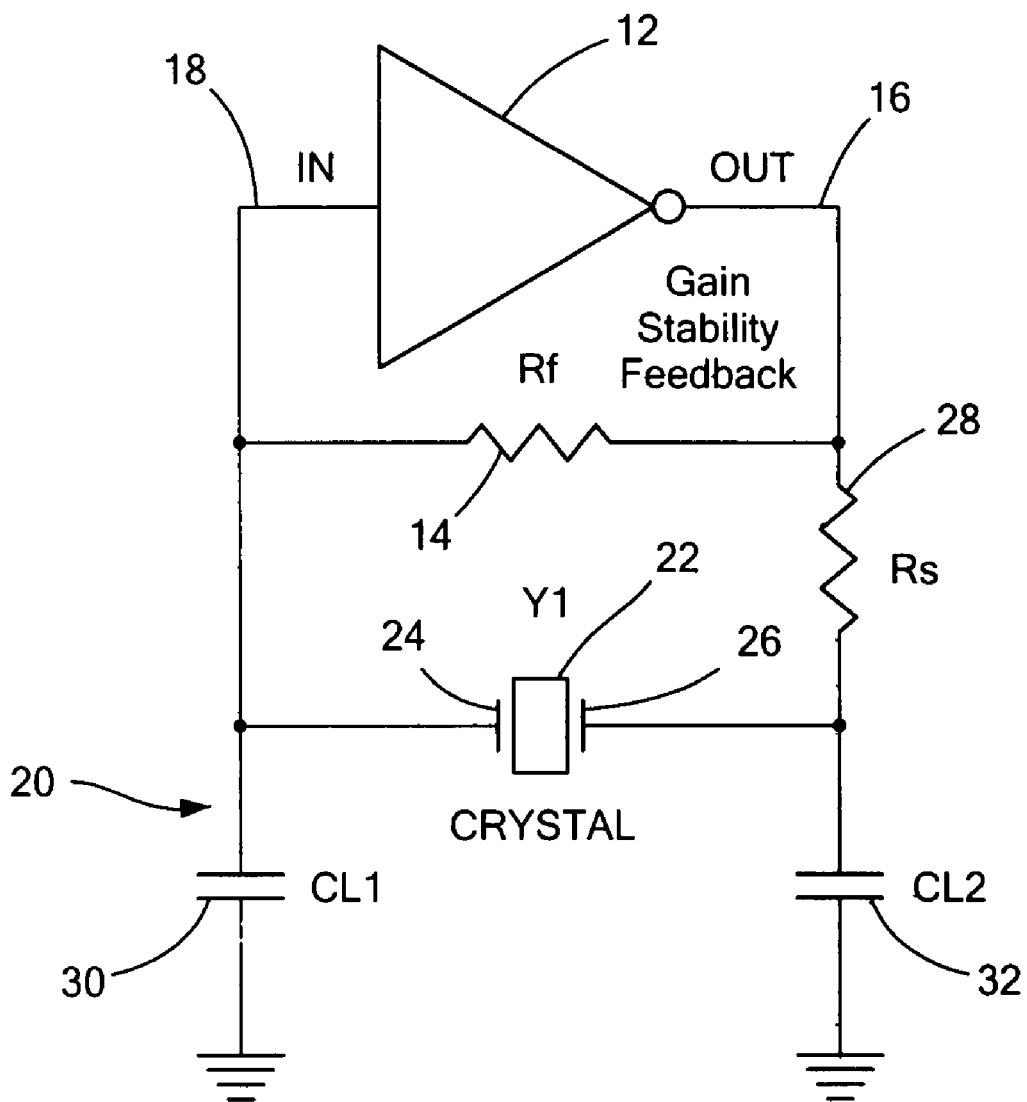
FIG. 1 is a schematic diagram of a prior art crystal oscillator inverter system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art crystal oscillator 10 including an inverter amplifier 12, with a feedback resistor 14 (Rf) connected between the output 16 and input 18 of inverter 12. A crystal system 20 including crystal 22 has its electrode 24 connected to input 18 of inverter 12 and has its electrode 26 connected through serial resistance 28 (Rs) to output 16. Crystal system 20 also includes load capacitors 30 and 32 which contribute to the tank circuit of crystal 22. The values of capacitors 30 and 32 are specified by the crystal manufacturer according to the intended use of crystal 22. Resistor 14 provides DC biasing of inverter 12 and also provides negative local feedback for inverter 12: this determines amplifier gain and tolerance of the inverter to changes in supply voltage and other environmental conditions. Serial resistance 28 stabilizes the output voltage of inverter amplifier 12 and is used to control the crystal drive level which is determined as the amount of AC energy supplied by the amplifier to the crystal system 20. Good frequency stability in the stationary mode of operation is provided by the minimum required level of drive voltage and minimal coupling of the crystal system 20 to inverter amplifier 12. This in turn requires a relatively small value of feedback resistance 14 and a relatively large value of the serial resistance 28. These conditions provide long term reliability and lower power consumption which is especially important when the so called "low power" miniaturized quartz crystals are used. In contrast reliable start up of oscillator 10 requires relatively large values of feedback resistance 14 and relatively small values of resistance 28. Thus the optimal values for resistances 14 and 28 are opposite for the different modes of the crystal oscillator 10 operation. That is, the stationary mode and the start up mode. This forces the design to compromise the feedback resistance Rf 14 and the serial resistance Rs 28 values to at least partly satisfy the requirements for stability and reliable start up while optimizing neither.

Figure 2:
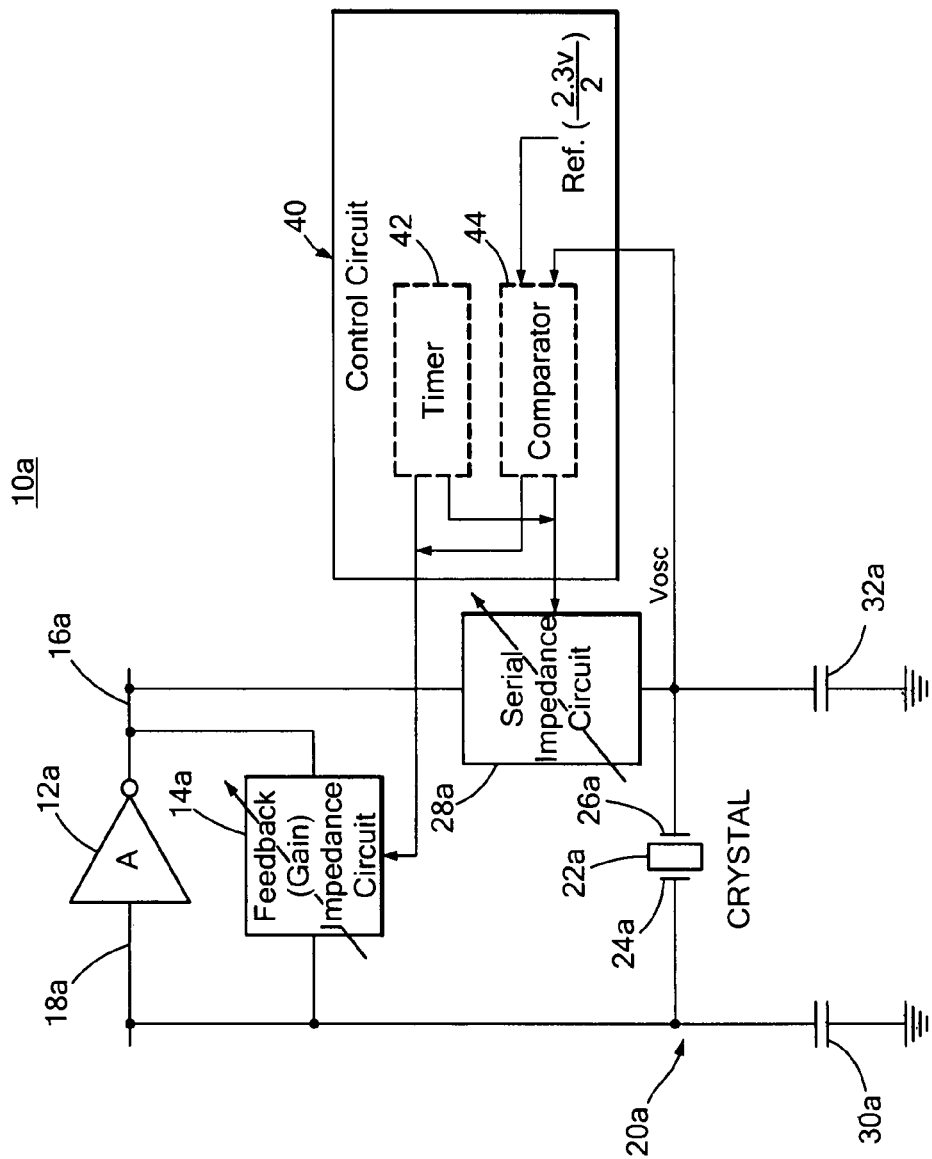
FIG. 2; is a schematic diagram of a crystal oscillator with a variable gain and variable output impedance inverter system according to this invention.

In accordance with this invention crystal oscillator 10a, FIG. 2, includes a feedback circuit 14a which has variable impedance and a serial circuit 28a which includes variable impedance. In addition, there is a control circuit 40 which may include either a timer 42 or a comparator 44. Control circuit 40 operates feedback circuit 14a and serial circuit 28a, so that it maintains feedback impedance circuit 14a at a low impedance and serial impedance circuit 28a at a high impedance in the normal, stationary, mode of operation, but temporarily, during start up mode, increases the impedance of the feedback circuit and decreases the impedance of the serial circuit, relative to the stationary mode impedances, to ensure a fast, reliable start up and then returns the feedback impedance to the lower impedance level and the serial circuit to the higher impedance level that promotes the high frequency stability of the oscillator in the normal stationary mode of operation. Control circuit 40 may use either timer 42 or comparator 44 to accomplish this. Comparator 44 compares, for example, the voltage on crystal system 22a, Vosc, to a reference voltage which is generally approximately one half of the voltage across the oscillator in stationary mode. When Vosc reaches the reference level comparator 44 temporarily shifts the impedances in feedback circuit 14a and serial circuit 28a. Alternatively, timer 42 may be used for the same purpose. Timer 42 may temporarily adjust the impedances in the same manner for a period of approximately 500 cycles of the crystal oscillator fundamental frequency. It is understood that at approximately 1,000 cycles of operation at the fundamental frequency the start up is virtually complete, thus at 500 cycles the start up mode is well underway and there is no further need to continue the start up mode boost as the start up will continue properly from that point.

Figure 3:
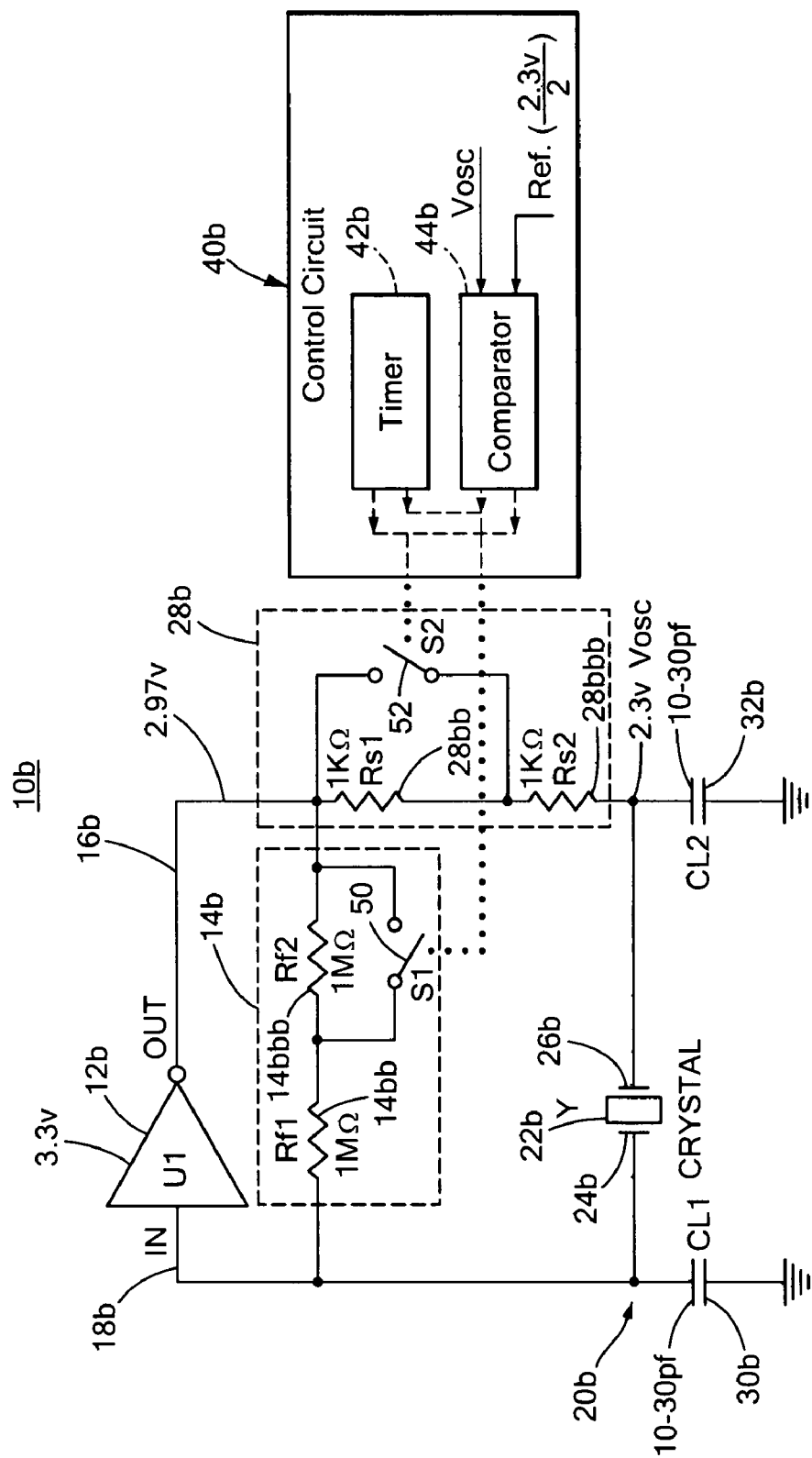
FIG. 3 is a schematic diagram of a crystal oscillator with a variable gain and variable output impedance inverter system according to this invention implemented with resistances and switches.

In one embodiment, a crystal oscillator 10b, FIG. 3, according to this invention may have a variable impedance feedback circuit 14b, which includes two resistances 14bb (Rf1) and 14bbb (Rf2) with a switch 50 shunting resistance 14bbb and the variable serial impedance 28b (Rs1) may include a single resistance 28bb accompanied by a shunt switch 52 so that when shunt switch 52 is closed there is no resistance in that line. Or there may be a second resistance (Rs2) 28bbb so that even when shunt switch 52 is closed there remains the resistance 28bbb. Typically, but in no way limiting, the resistance 14bb may be 1 meg Ω. Resistance 14bbb may be, again without limiting the invention, a different value or the same 1 M Ω value. Similarly, with the serial variable impedance circuit 28b resistance 28bb may be 1 k Ω for example and if there is a second resistance 28bbb it may be a different value or it may be 1 k Ω. Typically, capacitors 30b and 32b will be between 10 and 30 pf depending upon the frequency and other parameters. The supply voltage Vcc can be 3.3 volts. Typically the output 16b will be approximately 90% of that or 2.97 volts in stationary mode and so the oscillator voltage will be about 70% of that or 2.3 volts. In that case the reference voltage at comparator 44b will be roughly half of that at or 2.3 volt/2=1.15 volts.

In operation in the stationary mode when switch 50 is closed switch 52 is open. Resistance 14bb corresponds to low amplifier gain and high band width with low nonlinear distortion and high immunity to supply voltage variation and temperature changes, all of which serve to provide high frequency stability. Serial impedance circuit 28b has an impedance equal to the resistance of resistance 28b plus 28bb; this corresponds to low a low drive level for the crystal and further helps to provide high frequency stability. In contrast, at the start up mode, switch 50 is open and switch 52 is closed. Now the feedback impedance circuit has an impedance of resistance 14bb plus 14bbb which corresponds to high amplifier gain and helps to provide a reliable start up of the oscillator despite a number of different crystal parameters. The impedance of the serial impedance circuit now is only that of resistance 28bbb, if in fact there is one, otherwise the impedance is zero or very nearly zero. The value of zero or the value of resistance 28bbb, for example, 1 k Ω corresponds to high drive level of crystal and helps to provide better start up conditions.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A crystal oscillator with a variable gain and variable output impedance inverter system comprising:
   an inverter;
   a variable impedance feedback circuit connected between an output and an input of the inverter;
   a crystal system comprising a crystal having first and second electrodes connected across the input and the output of the inverter;
   a series variable impedance circuit connected between the inverter output and the second electrode of the crystal; and
   a control circuit for temporarily, during start up mode, increasing an impedance of the variable impedance feedback circuit and decreasing an impedance of the series variable impedance circuit relative to the stationary mode impedances,
   wherein the impedances of the variable impedance feedback circuit and the series variable impedance circuit are resistances.

2. The crystal oscillator of claim 1, wherein the variable impedance feedback circuit comprises first and second resistances in series and a first switch shunting one of the first or second resistances.

3. The crystal oscillator of claim 2, wherein the series variable impedance circuit comprises at least a third resistance and a second switch shunting the third resistance.

4. The crystal oscillator of claim 3, wherein the series variable impedance circuit comprises a fourth resistance in series with the third resistance.

5. The crystal oscillator of claim 4, wherein the first and second resistances are equal and the third and fourth resistances are equal.

6. The crystal oscillator of claim 1, wherein the crystal system comprises a load capacitor connected between each of the first and second electrodes and ground.

7. The crystal oscillator of claim 1, wherein the control circuit comprises a comparator responsive to the crystal oscillator voltage for temporarily increasing the impedance of the variable impedance feedback circuit and decreasing the impedance of the series variable impedance circuit during start up mode until a crystal oscillator voltage reaches a predetermined reference level.

8. The crystal oscillator of claim 7, wherein the predetermined reference level is approximately one half or more of a stationary mode crystal oscillator voltage.

9. The crystal oscillator of claim 1, wherein the control circuit comprises a timer for temporarily increasing the impedance of the variable impedance feedback circuit and decreasing the impedance of the series variable impedance circuit during start up mode for a period of approximately 500 cycles of a crystal oscillator frequency.

10. The crystal oscillator of claim 3, wherein the control circuit comprises a comparator responsive to the crystal oscillator voltage for temporarily operating the first and second switches during start up mode until a crystal oscillator voltage reaches a predetermined reference level.

11. The crystal oscillator of claim 3, wherein the control circuit comprises a timer for temporarily operating the first and second switches during start up mode for approximately 500 cycles of a crystal oscillator frequency.

* * * * *